(12) United States Patent
Xu et al.

(10) Patent No.: US 10,964,403 B2
(45) Date of Patent: Mar. 30, 2021

(54) SHIFT REGISTER UNIT, DRIVING METHOD, GATE DRIVING CIRCUIT AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Zhuo Xu, Beijing (CN); Sangsoo Kim, Beijing (CN); Yajie Bai, Beijing (CN); Yi Dan, Beijing (CN); Hailong Wu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 80 days.

(21) Appl. No.: 16/409,316

(22) Filed: May 10, 2019

(65) Prior Publication Data
US 2020/0013474 A1     Jan. 9, 2020

(30) Foreign Application Priority Data
Jul. 3, 2018    (CN) .......................... 201810717227.6

(51) Int. Cl.
*G11C 19/00* (2006.01)
*G11C 19/28* (2006.01)
*G09G 3/20* (2006.01)
*G09G 3/36* (2006.01)

(52) U.S. Cl.
CPC ............. *G11C 19/287* (2013.01); *G09G 3/20* (2013.01); *G09G 3/3677* (2013.01); *G09G 2300/0426* (2013.01); *G09G 2310/0286* (2013.01); *G09G 2310/08* (2013.01); *G09G 2320/0209* (2013.01)

(58) Field of Classification Search
None
See application file for complete search history.

(56) References Cited

U.S. PATENT DOCUMENTS

| | | | |
|---|---|---|---|
| 9,626,895 B2 * | 4/2017 | Tsai ..................... | G09G 3/3266 |
| 2016/0343338 A1 * | 11/2016 | Gu ........................ | G11C 19/287 |
| 2016/0358666 A1 * | 12/2016 | Pang ..................... | G09G 3/3688 |
| 2017/0178558 A1 * | 6/2017 | Zhou ..................... | G11C 19/28 |
| 2017/0330526 A1 * | 11/2017 | Fan ....................... | G09G 3/3677 |
| 2018/0018920 A1 * | 1/2018 | Kim ...................... | G09G 3/20 |
| 2019/0180834 A1 * | 6/2019 | Yuan ..................... | G09G 3/3677 |
| 2019/0228830 A1 * | 7/2019 | Xu ........................ | G11C 19/28 |
| 2020/0160767 A1 * | 5/2020 | Mi ......................... | G09G 3/20 |

* cited by examiner

*Primary Examiner* — Tuan T Lam
(74) *Attorney, Agent, or Firm* — Brooks Kushman P.C.

(57) ABSTRACT

A shift register unit includes a common circuit and an output circuit. The common circuit is configured to control a potential at a pull-up node under the control of an input end, a resetting end and a first clock signal input end. The output circuit is configured to control 2M gate driving signal output ends to output gate driving signals respectively under the control of the pull-up node, a noise reduction control end and an output control end, where M is an integer greater than 1.

17 Claims, 6 Drawing Sheets

SHIFT REGISTER UNIT, DRIVING METHOD, GATE DRIVING CIRCUIT AND DISPLAY DEVICE

CROSS-REFERENCE TO RELATED APPLICATION

This application claims priority to Chinese Patent Application No. 201810717227.6 filed on Jul. 3, 2018, which is incorporated herein by reference in its entirety.

TECHNICAL FIELD

The present disclosure relates to the field of display driving technology, in particular to a shift register unit, a driving method, a gate driving circuit and a display device.

BACKGROUND

In a conventional display device, a driving transistor of a pixel circuit is a common thin film transistor (TFT) having merely one gate electrode, so it is impossible to reduce a value of a high voltage VGH to be provided, resulting in a low charging rate. In addition, the number of shift register units of a conventional gate driving circuit needs to be the same as the number of rows of pixel circuits arranged on a display panel, and it is impossible to provide corresponding gate driving signals to at least two rows of pixel circuits through a single level of shift register unit, so a large number of transistors needs to be provided, and thereby it is adverse to the achievement of a narrow bezel.

SUMMARY

In one aspect, the present disclosure provides in some embodiments a shift register unit, including a common circuit and an output circuit. The common circuit is connected to a first clock signal input end, a second clock signal input end, an input end, a resetting end, a first voltage input end, a second voltage input end and a pull-up node, and configured to control a potential at the pull-up node under the control of the input end, the resetting end and the first clock signal input end. The output circuit is connected to the pull-up node, the first voltage input end, the second voltage input end, a noise reduction control end, an output control end and 2M gate driving signal output ends, and configured to control the 2M gate driving signal output ends to output gate driving signals respectively under the control of the pull-up node, the noise reduction control end and the output control end, where M is an integer greater than 1.

In a possible embodiment of the present disclosure, the common circuit includes a pull-up control node control sub-circuit and a pull-up node control sub-circuit. The pull-up control node control sub-circuit is connected to the input end, the resetting end, the first clock signal input end, the first voltage input end, the second voltage input end and a pull-up control node, and configured to control a potential at the pull-up control node under the control of the input end, the resetting end and the first clock signal input end. The pull-up node control sub-circuit is connected to the pull-up control node, the pull-up node, the first clock signal input end, the second clock signal input end and the second voltage input end, and configured to control the potential at the pull-up node under the control of the pull-up control node and the first clock signal input end.

In a possible embodiment of the present disclosure, M is 2. The pull-up control node control sub-circuit includes: a first pull-up control node control transistor, a gate electrode of which is connected to the input end, a first electrode of which is connected to the first voltage input end or the input end, and a second electrode of which is connected to the pull-up control node; a second pull-up control node control transistor, a gate electrode of which is connected to the first clock signal input end, a first electrode of which is connected to the input end, and a second electrode of which is connected to the pull-up control node; and a third pull-up control node control transistor, a gate electrode of which is connected to the resetting end, a first electrode of which is connected to the pull-up control node, and a second electrode of which is connected to the second voltage input end.

In a possible embodiment of the present disclosure, M is 2. The pull-up node control sub-circuit includes: a first pull-up node control transistor, a gate electrode of which is connected to the pull-up control node, a first electrode of which is connected to the second clock signal input end, and a second electrode of which is connected to the pull-up node; a second pull-up node control transistor, a gate electrode of which is connected to the first clock signal input end, a first electrode of which is connected to the pull-up node, and a second electrode of which is connected to the second voltage input end; and a storage capacitor, a first end of which is connected to the pull-up control node, and a second end of which is connected to the pull-up node.

In a possible embodiment of the present disclosure, the noise reduction control end includes a third clock signal input end and a fourth clock signal input end, and the output control end includes the first clock signal input end. M is 2. The shift register unit includes a first gate driving signal output end, a second gate driving signal output end, a third gate driving signal output end and a fourth gate driving signal output end. The output circuit includes: a first output transistor, a gate electrode of which is connected to the pull-up node, a first electrode of which is connected to the first gate driving signal output end, and a second electrode of which is connected to the fourth clock signal input end; a second output transistor, a gate electrode of which is connected to the pull-up node, a first electrode of which is connected to the third clock signal input end, and a second electrode of which is connected to the second gate driving signal output end; a third output transistor, a gate electrode of which is connected to the pull-up node, a first electrode of which is connected to the third clock signal input end, and a second electrode of which is connected to the third gate driving signal output end; a fourth output transistor, a gate electrode of which is connected to the pull-up node, a first electrode of which is connected to the fourth gate driving signal output end, and a second electrode of which is connected to the fourth clock signal input end; a fifth output transistor, a gate electrode of which is connected to the first clock signal input end, a first electrode of which is connected to the first gate driving signal output end, and a second electrode of which is connected to the first voltage input end; a sixth output transistor, a gate electrode of which is connected to the first clock signal input end, a first electrode of which is connected to the first voltage input end, and a second electrode of which is connected to the third gate driving signal output end; a first noise reduction transistor, a gate electrode of which is connected to the fourth clock signal input end, a first electrode of which is connected to the second gate driving signal output end, and a second electrode of which is connected to the second voltage input end; and a second noise reduction transistor, a gate electrode of which is connected to the third clock signal input end, a first electrode of which is connected to the fourth gate driving signal output end, and a second electrode of which is connected to the second voltage input end.

In a possible embodiment of the present disclosure, the noise reduction control end includes the first clock signal input end, and the output control end includes the first clock signal input end. M is 2. The shift register unit includes a first gate driving signal output end, a second gate driving signal output end, a third gate driving signal output end and a fourth gate driving signal output end. The output circuit includes: a first output transistor, a gate electrode of which is connected to the pull-up node, a first electrode of which is connected to the first gate driving signal output end, and a second electrode of which is connected to the fourth clock signal input end; a second output transistor, a gate electrode of which is connected to the pull-up node, a first electrode of which is connected to the third clock signal input end, and a second electrode of which is connected to the second gate driving signal output end; a third output transistor, a gate electrode of which is connected to the pull-up node, a first electrode of which is connected to the third clock signal input end, and a second electrode of which is connected to the third gate driving signal output end; a fourth output transistor, a gate electrode of which is connected to the pull-up node, a first electrode of which is connected to the fourth gate driving signal output end, and a second electrode of which is connected to the fourth clock signal input end; a fifth output transistor, a gate electrode of which is connected to the first clock signal input end, a first electrode of which is connected to the first gate driving signal output end, and a second electrode of which is connected to the first voltage input end; a sixth output transistor, a gate electrode of which is connected to the first clock signal input end, a first electrode of which is connected to the first voltage input end, and a second electrode of which is connected to the third gate driving signal output end; a first noise reduction transistor, a gate electrode of which is connected to the first clock signal input end, a first electrode of which is connected to the second gate driving signal output end, and a second electrode of which is connected to the second voltage input end; and a second noise reduction transistor, a gate electrode of which is connected to the first clock signal input end, a first electrode of which is connected to the fourth gate driving signal output end, and a second electrode of which is connected to the second voltage input end.

In a possible embodiment of the present disclosure, the first voltage input end is a high voltage input end, and a second voltage input end is a low voltage input end.

In a possible embodiment of the present disclosure, a first clock signal has a phase reverse to a second clock signal, a third clock signal has a phase reverse to a fourth clock signal, and a frequency of the first clock signal is half of a frequency of the third clock signal.

In another aspect, the present disclosure provides in some embodiments a method for driving the above-mentioned shift register unit, including: controlling, by a common circuit, a potential at a pull-up node under the control of an input end, a resetting end and a first clock signal input end; and controlling, by an output circuit, 2M gate driving signal output ends to output gate driving signals respectively under the control of the pull-up node, a noise reduction end and an output control end, where M is an integer greater than 1.

In a possible embodiment of the present disclosure, the common circuit includes a pull-up control node control sub-circuit and a pull-up node control sub-circuit. The controlling, by the common circuit, the potential at the pull-up node under the control of the input end, the resetting end and the first clock signal input end includes: controlling, by the pull-up control node control sub-circuit, a potential at a pull-up control node under the control of the input end, the resetting end and the first clock signal input end; and controlling, by the pull-up node control sub-circuit, the potential at the pull-up node under the control of the pull-up control node and the first clock signal input end.

In a possible embodiment of the present disclosure, M is 2. The controlling, by the pull-up control node control sub-circuit, the potential at the pull-up control node under the control of the input end, the resetting end and the first clock signal input end includes: at an input stage, controlling, by the pull-up control node control sub-circuit, the pull-up control node to be electrically connected to a first voltage input end or the input end under the control of the input end, and controlling, by the pull-up control node control sub-circuit, an input signal from the input end to be written into the pull-up control node under the control of the first clock signal input end; at an output stage, bootstrapping, by the pull-up control node control sub-circuit, the potential at the pull-up control node; and at a resetting stage, resetting, by the pull-up control node control sub-circuit, the potential at the pull-up control node under the control end of the resetting end and the first clock signal input end.

In a possible embodiment of the present disclosure, M is 2. The controlling, by the pull-up node control sub-circuit, the potential at the pull-up node under the control of the pull-up control node and the first clock signal input end includes: at the input stage, controlling, by the pull-up node control sub-circuit, the pull-up node to be electrically connected to a second clock signal input end under the control of the pull-up control node, and controlling, by the pull-up node control sub-circuit, the pull-up node to be electrically connected to a second voltage input end under the control of the first clock signal input end, so as to enable the potential at the pull-up node to be a second voltage; at the output stage, controlling, by the pull-up node control sub-circuit, the pull-up node to be electrically connected to the second clock signal input end under the control of the pull-up control node, so as to enable the potential at the pull-up node to be an active voltage; and at the resetting stage, controlling, by the pull-up node control sub-circuit, the pull-up node to be electrically connected to the second voltage input end under the control of the first clock signal input end, so as to reset the potential at the pull-up node.

In a possible embodiment of the present disclosure, the output stage includes a first output time period and a second output time period arranged sequentially, and the output control end includes the first clock signal input end. The controlling, by the output circuit, the 2M gate driving signal output ends to output gate driving signals respectively under the control of the pull-up node, the noise reduction control end and the output control end includes: at the input stage and the resetting stage, controlling, by the output circuit, a first gate driving signal output end and a third gate driving signal output end to be electrically connected to the first voltage input end under the control of the first clock signal input end, controlling, by the output circuit, a fourth gate driving signal output end to be electrically connected to the second voltage input end under the control of the noise reduction control end, and controlling, by the output circuit, a second gate driving signal output end to be electrically connected to the second voltage input end under the control of the noise reduction control end, so as to enable the first gate driving signal output end and the third gate driving signal output end to output a first voltage, and enable the second gate driving signal output end and the fourth gate driving signal output end to output the second voltage;

within the first output time period, controlling, by the output circuit, the first gate driving signal output end to be electrically connected to a fourth clock signal input end, controlling the second gate driving signal output end to be electrically connected to a third clock signal input end, controlling the fourth gate driving signal output end to be electrically connected to the fourth clock signal input end and controlling the third gate driving signal output end to be electrically connected to the third clock signal input end under the control of the pull-up node, and controlling, by the output circuit, the fourth gate driving signal output end to be electrically connected to the second voltage input end under the control of the third clock signal input end, so as to enable the first gate driving signal output end and the fourth gate driving signal output end to output the second voltage, and enable the second gate driving signal output end and the third gate driving signal output end to output the first voltage; and within the second output time period, controlling, by the output circuit, the first gate driving signal output end to be electrically connected to the fourth clock signal input end, controlling the second gate driving signal output end to be electrically connected to the third clock signal input end, controlling the fourth gate driving signal output end to be electrically connected to the fourth clock signal input end and controlling the third gate driving signal output end to be electrically connected to the third clock signal input end under the control of the pull-up node, and controlling, by the output circuit, the second gate driving signal output end to be electrically connected to the second voltage input end under the control of the third clock signal input end, so as to enable the first gate driving signal output end and the fourth gate driving signal output end to output the first voltage, and enable the second gate driving signal output end and the third gate driving signal output end to output the second voltage.

In yet another aspect, the present disclosure provides in some embodiments a gate driving circuit including a plurality of levels of the above-mentioned shift register units connected to each other in cascaded manner. An input end of a first level of shift register unit of the gate driving circuit is configured to receive a corresponding input signal, and a resetting end of a last-level shift register unit is configured to receive a corresponding resetting signal. An input end of an $A^{th}$ level of shift register unit is connected to a $(2M)^{th}$ gate driving signal output end of an $(A-1)^{th}$ level of shift register unit, and a resetting end of a $B^{th}$ level of shift register unit is connected to a second gate driving signal output end of a $(B+1)^{th}$ level of shift register unit, where A is an integer greater than 1, M is an integer greater than 1, and B is a positive integer and smaller than the number of levels of the shift register units of the gate driving circuit.

In still yet another aspect, the present disclosure provides in some embodiments a display device including the above-mentioned gate driving circuit.

In a possible embodiment of the present disclosure, the display device further includes a display substrate and pixel units arranged in an array form on the display substrate. Each pixel unit includes a switching transistor, and the switching transistor is a double-gate transistor. A first gate driving signal output end of an $n^{th}$ level of shift register unit is connected to first gate electrodes of the switching transistors of pixel units in a $(2n-1)^{th}$ row, a second gate driving signal output end of the $n^{th}$ level of shift register unit is connected to second gate electrodes of the switching transistors of the pixel units in the $(2n-1)^{th}$ row, a third gate driving signal output end of the $n^{th}$ level of shift register unit is connected to first gate electrodes of the switching transistors of pixel units in a $(2n)^{th}$ row, and a fourth gate driving signal output end of the $n^{th}$ level of shift register unit is connected to second gate electrodes of the switching transistors of the pixel units in the $(2n)^{th}$ row, where n is a positive integer.

DETAILED DESCRIPTION

Figure 1:
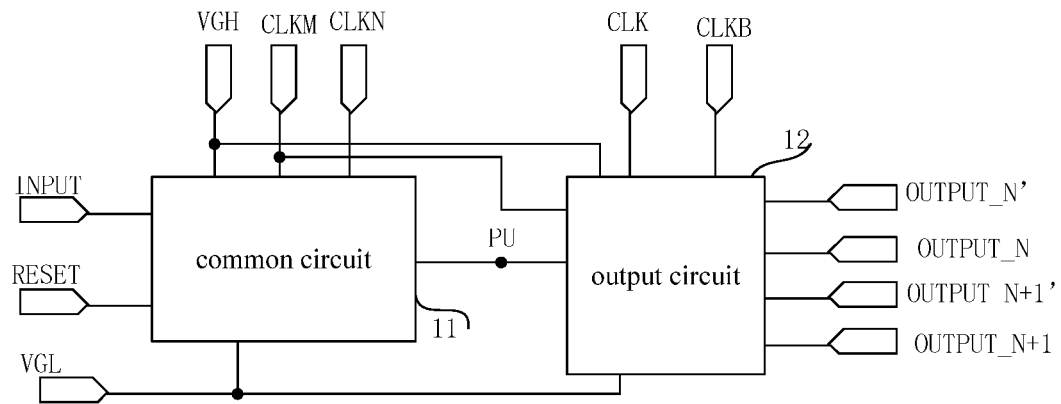
FIG. 1 is a schematic view showing a shift register unit according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be TFTs, field effect transistors (FETs) or any other elements having an identical characteristic. In order to differentiate two electrodes other than a gate electrode from each other, one of the two electrodes is called as first electrode and the other is called as second electrode. In actual use, the first electrode may be a drain electrode while the second electrode may be a source electrode, or the first electrode may be a source electrode while the second electrode may be a drain electrode.

The present disclosure provides in some embodiments a shift register unit which includes a common circuit and an output circuit. The common circuit is connected to a first clock signal input end, a second clock signal input end, an input end, a resetting end, a first voltage input end, a second voltage input end and a pull-up node, and configured to control a potential at the pull-up node under the control of the input end, the resetting end and the first clock signal input end. The output circuit is connected to the pull-up node, the first voltage input end, the second voltage input end, a noise reduction control end, an output control end and 2M gate driving signal output ends, and configured to control the 2M gate driving signal output ends to output gate driving signals respectively under the control of the pull-up node, the noise reduction control end and the output control end, where M is an integer greater than 1.

According to the shift register unit in the embodiments of the present disclosure, through the common circuit and the output circuit, the corresponding gate driving signals may be applied to a first gate electrode and a second gate electrode of each driving transistor of pixels circuits in at least two rows respectively. As a result, it is able to reduce the number of the transistors of the shift register unit, thereby to facilitate the achievement of a narrow bezel.

In addition, through the shift register unit in the embodiments of the present disclosure, the gate driving signals may be applied to a top gate electrode and a bottom gate electrode of the double-gate driving transistor of the pixel circuit respectively, so it is able to reduce a value of a high voltage VGH to be applied, thereby to increase a charging rate.

During the implementation, the first voltage input end may be, but not limited to, a high voltage input end, and the second voltage input end may be, but not limited to, a low voltage input end.

In the embodiments of the present disclosure, each driving transistor of the pixel circuit may be a double-gate transistor including a first gate electrode and a second gate electrode. In one circumstance, the first gate electrode may correspond to a p-type channel while the second gate electrode may correspond to an n-type channel. In another circumstance, the first gate electrode may correspond to an n-type channel while the second gate electrode may correspond to a p-type channel.

In actual use, the first gate electrode may be a top gate electrode, and the second gate electrode may be a bottom gate electrode.

In addition, in actual use, the first gate electrode and the second gate electrode may both correspond to the p-type channel, or the n-type channel.

During the implementation, when each driving transistor of the pixel circuit is the double-gate transistor, it is able to reduce the value of the high voltage VGH to be applied, thereby to increase the charging rate.

The shift register unit will be described hereinafter by taking M=2 as an example.

As shown in FIG. 1, the shift register unit may include a common circuit 11 and an output circuit 12.

The common circuit 11 may be connected to a first clock signal input end CLKM, a second clock signal input end CLKN, an input end INPUT, a resetting end RESET, a high voltage input end, a low voltage input end and a pull-up node PU, and configured to control a potential at the pull-up node PU under the control of the input end INPUT, the resetting end RESET and the first clock signal input end CLKM. The high voltage input end is configured to apply a high voltage VGH, and the low voltage input end is configured to apply a low voltage VGL.

The output circuit 12 may be connected to the pull-up node PU, the high voltage input end, the low voltage input end, a third clock signal input end CLK, a fourth clock signal input end CLKB, a noise reduction control end (in this embodiment, the noise reduction control end may include the third clock signal input end CLK and the fourth clock signal input end CLKB), an output control end (in which embodiment, the output control end may include the first clock signal input end CLKM), a first gate driving signal output end OUTPUT_N', a second gate driving signal output end OUTPUT_N, a third gate driving signal output end OUTPUT_N+1', and a fourth gate driving signal output end OUTPUT_N+1, and configured to, under the control of the pull-up node PU, the third clock signal input end CLK, the fourth clock signal input end CLKB and the first clock signal input end CLKM, control the first gate driving signal output end OUTPUT_N' to output a first gate driving signal, control the second gate driving signal output end OUTPUT_N to output a second gate driving signal, control the third gate driving signal output end OUTPUT_N+1' to output a third gate driving signal, and control the fourth gate driving signal output end OUTPUT_N+1 to output a fourth gate driving signal.

Illustratively but not restrictively, OUTPUT_N' may output a corresponding gate driving signal to a first gate electrode of each driving transistor of pixel circuits in an $N^{th}$ row, OUTPUT_N may output a corresponding gate driving signal to a second gate electrode of each driving transistor of the pixel circuits in the $N^{th}$ row, OUTPUT_N+1 may output a corresponding gate driving signal to a second gate electrode of each driving transistor of pixel circuits in an $(N+1)^{th}$ row, and OUTPUT_N+1' may output a corresponding gate driving signal to a first gate electrode of each driving transistor of the pixel circuits in the $(N+1)^{th}$ row, where N is a positive integer.

Figure 2:
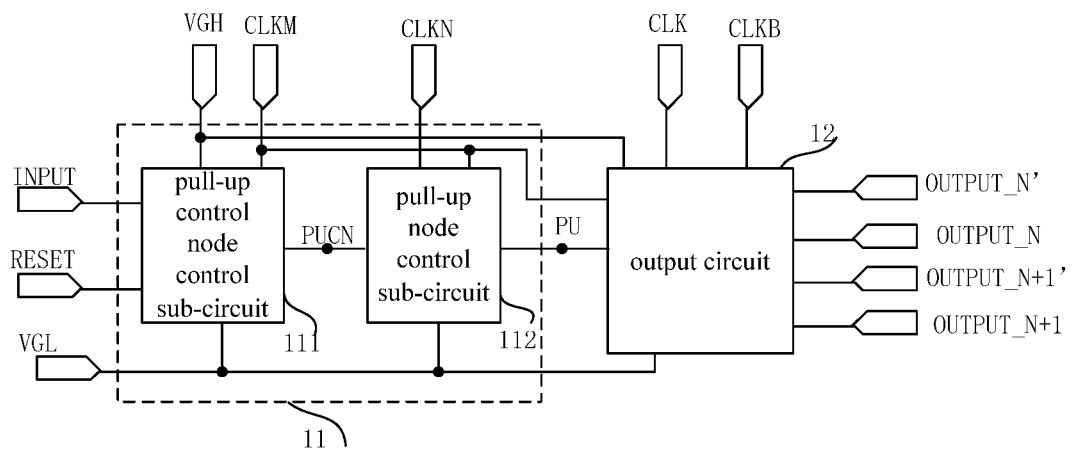
FIG. 2 is another schematic view showing the shift register unit according to one embodiment of the present disclosure.

As shown in FIG. 2, on the basis of the shift register unit in FIG. 1, the common circuit 11 may include a pull-up control node control sub-circuit 111 and a pull-up node control sub-circuit 112. The pull-up control node control sub-circuit 111 may be connected to the input end INPUT, the resetting end RESET, the first clock signal input end CLKM, the high voltage input end, the low voltage input end and a pull-up control node PUCN, and configured to control a potential at the pull-up control node PUCN under the control of the input end INPUT, the resetting end RESET and the first clock signal input end CLKM. The pull-up node control sub-circuit 112 may be connected to the pull-up control node PUCN, the pull-up node PU, the first clock signal input end CLKM, the second clock signal input end CLKN and the low voltage input end, and configured to control the potential at the pull-up node PU under the control of the pull-up control node PUCN and the first clock signal input end CLKM.

During the operation of the shift register unit in FIG. 2, at an input stage, the pull-up control node control sub-circuit 111 may control the pull-up control node PUCN to be electrically connected to the high voltage input end or the input end INPUT under the control of the input end INPUT, and control an input signal from the input end INPUT to be written into the pull-up control node PUCN under the control of the first clock signal input end CLKM. The pull-up node control sub-circuit 112 may control the pull-up node PU to be electrically connected to the second clock signal input end CLKN under the control of the pull-up control node PUCN, and control the pull-up node PU to be electrically connected to the low voltage input end under the control of the first clock signal input end CLKM, so as to enable the potential at the pull-up node PU to be a low voltage VGL. The output circuit 12 may control the first gate driving signal output end OUTPUT_N' and the third gate driving signal output end OUTPUT_N+1' to receive a high voltage VGBH under the control of the first clock signal input end CLKM, control the fourth gate driving signal output end OUTPUT_N+1 to receive the low voltage VGL under the control of the first clock signal input end CLKM, and control the second gate driving signal output end OUTPUT_N to receive the low voltage VGL under the control of the fourth clock signal input end CLKB, so as to enable the first gate driving signal output end OUTPUT_N' and the third gate driving signal output end OUTPUT_N+1' to output the high voltage VGH, and enable the second gate driving signal output end OUTPUT_N and the fourth gate driving signal output end OUTPUT_N+1 to output the low voltage VGL.

Within a first output time period of an output stage, the pull-up control node control sub-circuit 111 may bootstrap the potential at the pull-up control node PUCN. The pull-up node control sub-circuit 112 may control the pull-up node PU to be electrically connected to the second clock signal input end CLKN under the control of the pull-up control node PUCN, so as to enable the potential at the pull-up node PU to be an active voltage. The output circuit 12 may, under the control of the pull-up node PU, control the first gate driving signal output end OUTPUT_N' to be electrically connected to the fourth clock signal input end CLKB, control the second gate driving signal output end OUTPUT_N to be electrically connected to the third clock signal input end CLK, control the fourth gate driving signal output end OUTPUT_N+1 to be electrically connected to the fourth clock signal input end CLKB, and control the third gate driving signal output end OUTPUT_N+1' to be electrically connected to the third clock signal input end CLK. In addition, the output circuit 12 may, under the control of the third clock signal input end CLK, control the fourth gate driving signal output end OUTPUT_N+1 to receive the low voltage VGL, so as to enable the first gate driving signal output end OUTPUT_N' and the fourth gate driving signal output end OUTPUT_N+1 to output the low voltage VGL, and enable the second gate driving signal output end OUTPUT_N and the third gate driving signal output end OUTPUT_N+1 to output the high voltage VGH.

Within a second output time period of the output stage, the pull-up control node control sub-circuit 111 may bootstrap the potential at the pull-up control node PUCN. The pull-up node control sub-circuit 112 may control the pull-up node PU to be electrically connected to the second clock signal input end CLKN under the control of the pull-up control node PUCN, so as to enable the potential at the pull-up node PU to be an active voltage. The output circuit 12 may, under the control of the pull-up node PU, control the first gate driving signal output end OUTPUT_N' to be electrically connected to the fourth clock signal input end CLKB, control the second gate driving signal output end OUTPUT_N to be electrically connected to the third clock signal input end CLK, control the fourth gate driving signal output end OUTPUT_N+1 to be electrically connected to the fourth clock signal input end CLKB, and control the third gate driving signal output end OUTPUT_N+1' to be electrically connected to the third clock signal input end CLK. In addition, the output circuit 12 may, under the control of the third clock signal input end CLK, control the second gate driving signal output end OUTPUT_N to receive the low voltage VGL, so as to enable the first gate driving signal output end OUTPUT_N' and the fourth gate driving signal output end OUTPUT_N+1 to output the high voltage VGH, and enable the second gate driving signal output end OUTPUT_N and the third gate driving signal output end OUTPUT_N+1' to output the low voltage VGL.

At a resetting stage, the pull-up control node control sub-circuit 111 may reset the potential at the pull-up control node PUCN under the control of the resetting end RESET and the first clock signal input end CLKM. The pull-up node control sub-circuit 112 may control the pull-up node PU to receive the low voltage VGL under the control of the first clock signal input end CLKM, so as to reset the potential at the pull-up node PU. The output circuit 12 may control the first gate driving signal output end OUTPUT_N' and the third gate driving signal output end OUTPUT_N+1' to receive the high voltage VGH under the control of the first clock signal input end CLKM, control the fourth gate driving signal output end OUTPUT_N+1 to receive the low voltage VGL under the control of the first clock signal input end CLKM, and control the second gate driving signal output end OUTPUT_N to receive the low voltage VGL under the control of the fourth clock signal input end CLKB, so as to enable the first gate driving signal output end OUTPUT_N' and the third gate driving signal output end OUTPUT_N+1' to output the high voltage VGH, and enable the second gate driving signal output end OUTPUT_N and the fourth gate driving signal output end OUTPUT_N+1 to output the low voltage VGL.

Figure 3:
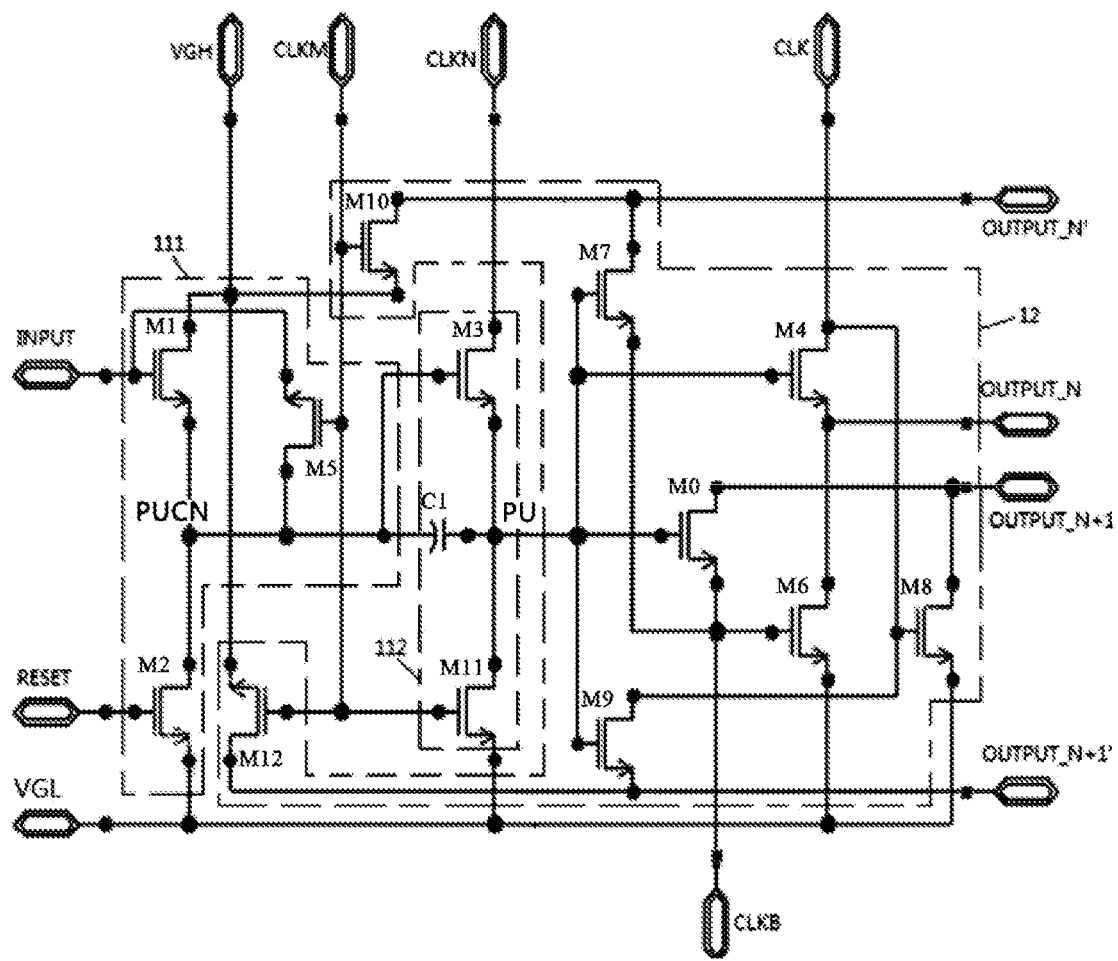
FIG. 3 is a circuit diagram of the shift register unit according to a first embodiment of the present disclosure.
Figure 5:
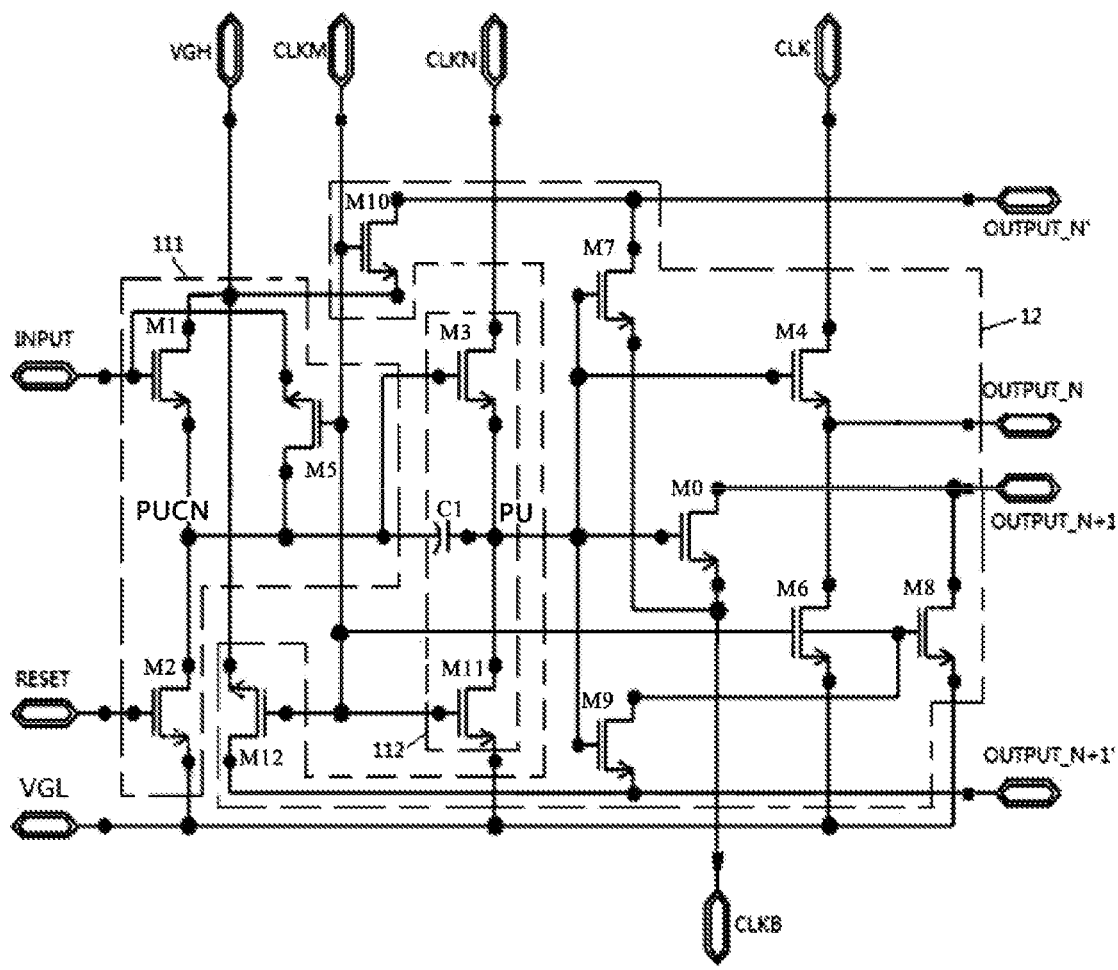
FIG. 5 is a circuit diagram of the shift register unit according to a second embodiment of the present disclosure.
Figure 6:
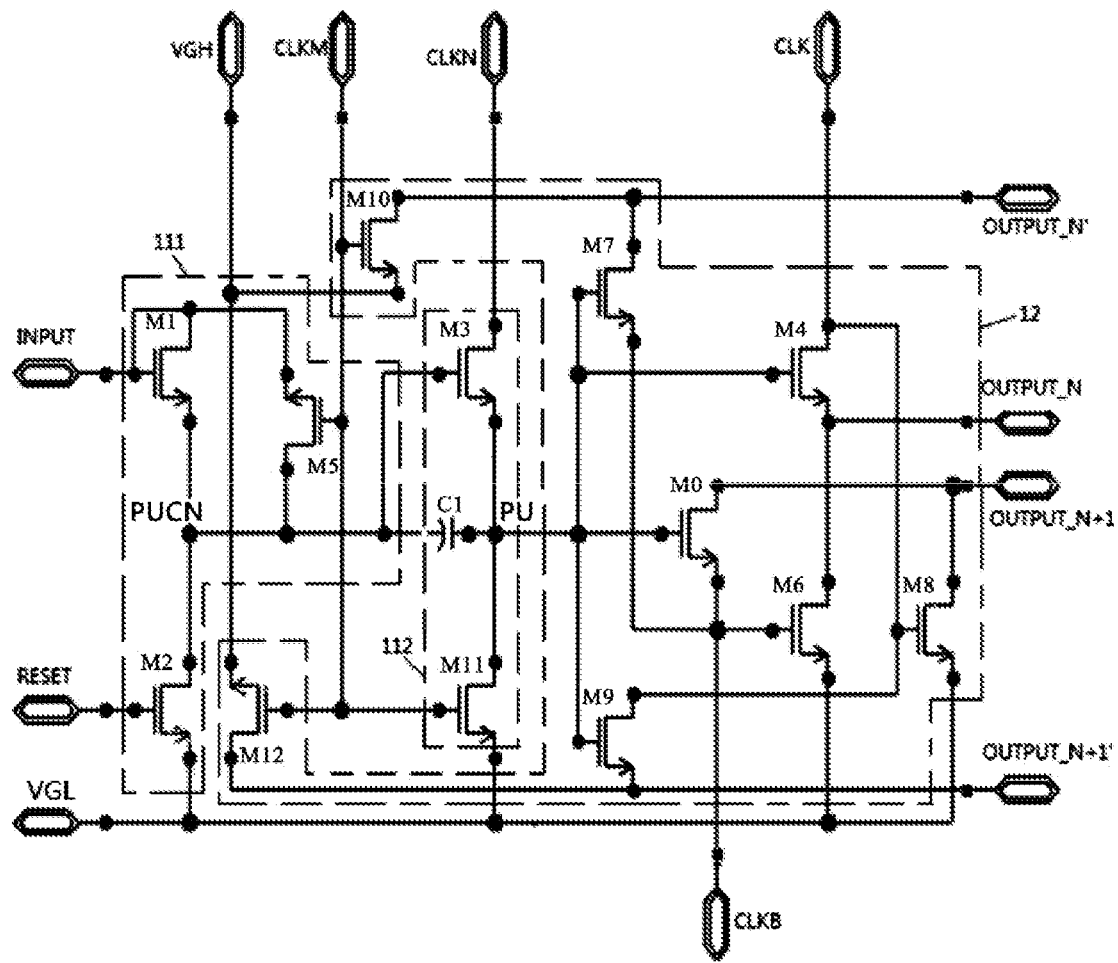
FIG. 6 is a circuit diagram of the shift register unit according to a third embodiment of the present disclosure.

The active voltage refers to a voltage capable of turning on each output transistor whose gate electrode is connected to the pull-up node PU. In a first embodiment as shown in FIG. 3, a second embodiment as shown in FIG. 5 and a third embodiment as shown in FIG. 6, the output transistors may include a first output transistor, a second output transistor, a third output transistor and a fourth output transistor. When each output transistor is an n-type transistor, the active voltage may be a high voltage, and when the output transistor is a p-type transistor, the active voltage may be a low voltage.

To be specific, M may be 2. The pull-up control node control sub-circuit may include: a first pull-up control node control transistor, a gate electrode of which is connected to the input end, a first electrode of which is connected to the first voltage input end or the input end, and a second electrode of which is connected to the pull-up control node; a second pull-up control node control transistor, a gate electrode of which is connected to the first clock signal input end, a first electrode of which is connected to the input end, and a second electrode of which is connected to the pull-up control node; and a third pull-up control node control transistor, a gate electrode of which is connected to the resetting end, a first electrode of which is connected to the pull-up control node, and a second electrode of which is connected to the second voltage input end. The pull-up node control sub-circuit may include: a first pull-up node control transistor, a gate electrode of which is connected to the pull-up control node, a first electrode of which is connected to the second clock signal input end, and a second electrode of which is connected to the pull-up node; a second pull-up node control transistor, a gate electrode of which is connected to the first clock signal input end, a first electrode of which is connected to the pull-up node, and a second electrode of which is connected to the second voltage input end; and a storage capacitor, a first end of which is connected to the pull-up control node, and a second end of which is connected to the pull-up node.

In a possible embodiment of the present disclosure, the noise reduction control end may include a third clock signal input end and a fourth clock signal input end, and the output control end may include the first clock signal input end. M may be 2. The shift register unit may include a first gate driving signal output end, a second gate driving signal output end, a third gate driving signal output end and a fourth gate driving signal output end. The output circuit may include: a first output transistor, a gate electrode of which is connected to the pull-up node, a first electrode of which is connected to the first gate driving signal output end, and a second electrode of which is connected to the fourth clock signal input end; a second output transistor, a gate electrode of which is connected to the pull-up node, a first electrode of which is connected to the third clock signal input end, and a second electrode of which is connected to the second gate driving signal output end; a third output transistor, a gate electrode of which is connected to the pull-up node, a first electrode of which is connected to the third clock signal input end, and a second electrode of which is connected to the third gate driving signal output end; a fourth output transistor, a gate electrode of which is connected to the pull-up node, a first electrode of which is connected to the fourth gate driving signal output end, and a second electrode of which is connected to the fourth clock signal input end; a fifth output transistor, a gate electrode of which is connected to the first clock signal input end, a first electrode of which is connected to the first gate driving signal output end, and a second electrode of which is connected to the first voltage input end; a sixth output transistor, a gate electrode of which is connected to the first clock signal input end, a first electrode of which is connected to the first voltage input end, and a second electrode of which is connected to the third gate driving signal output end; a first noise reduction transistor, a gate electrode of which is connected to the fourth clock signal input end, a first electrode of which is connected to the second gate driving signal output end, and a second electrode of which is connected to the second voltage input end; and a second noise reduction transistor, a gate electrode of which is connected to the third clock signal input end, a first electrode of which is connected to the fourth gate driving signal output end, and a second electrode of which is connected to the second voltage input end.

In another possible embodiment of the present disclosure, the noise reduction control end may include the first clock signal input end, and the output control end may include the first clock signal input end. M may be 2. The shift register unit may include a first gate driving signal output end, a second gate driving signal output end, a third gate driving signal output end and a fourth gate driving signal output end. The output circuit includes: a first output transistor, a gate electrode of which is connected to the pull-up node, a first electrode of which is connected to the first gate driving signal output end, and a second electrode of which is connected to the fourth clock signal input end; a second output transistor, a gate electrode of which is connected to the pull-up node, a first electrode of which is connected to the third clock signal input end, and a second electrode of which is connected to the second gate driving signal output end; a third output transistor, a gate electrode of which is connected to the pull-up node, a first electrode of which is connected to the third clock signal input end, and a second electrode of which is connected to the third gate driving signal output end; a fourth output transistor, a gate electrode of which is connected to the pull-up node, a first electrode of which is connected to the fourth gate driving signal output end, and a second electrode of which is connected to the fourth clock signal input end; a fifth output transistor, a gate electrode of which is connected to the first clock signal input end, a first electrode of which is connected to the first gate driving signal output end, and a second electrode of which is connected to the first voltage input end; a sixth output transistor, a gate electrode of which is connected to the first clock signal input end, a first electrode of which is connected to the first voltage input end, and a second electrode of which is connected to the third gate driving signal output end; a first noise reduction transistor, a gate electrode of which is connected to the first clock signal input end, a first electrode of which is connected to the second gate driving signal output end, and a second electrode of which is connected to the second voltage input end; and a second noise reduction transistor, a gate electrode of which is connected to the first clock signal input end, a first electrode of which is connected to the fourth gate driving signal output end, and a second electrode of which is connected to the second voltage input end.

The shift register unit will be described hereinafter in conjunction with three embodiments.

As shown in FIG. 3, in a first embodiment of the present disclosure, the shift register unit may include the common circuit and the output circuit 12, and M may be 2. The common circuit may include the pull-up control node control sub-circuit 111 and the pull-up node control sub-circuit 112.

The pull-up control node control sub-circuit 111 may include: a first pull-up control node control transistor M1, a gate electrode of which is connected to the input end INPUT, a drain electrode of which is connected to the high voltage input end for applying the high voltage VGH, and a source electrode of which is connected to the pull-up control node PUCN; a second pull-up control node control transistor M5, a gate electrode of which is connected to the first clock signal input end CLKM, a drain electrode of which is connected to the input end INPUT, and a source electrode of which is connected to the pull-up control node PUCN; and a third pull-up control node control transistor M2, a gate electrode of which is connected to the resetting end RESET, a drain electrode of which is connected to the pull-up control node PUCN, and a source electrode of which is connected to the low voltage input end.

The pull-up node control sub-circuit 112 may include: a first pull-up node control transistor M3, a gate electrode of which is connected to the pull-up control node PUCN, a drain electrode of which is connected to the second clock signal input end CLKN, and a source electrode of which is connected to the pull-up node PU; a second pull-up node control transistor M11, a gate electrode of which is connected to the first clock signal input end CLKM, a drain electrode of which is connected to the pull-up node PU, and a source electrode of which is connected to the low voltage input end for applying the low voltage VGL; and a storage capacitor C1, a first end of which is connected to the pull-up control node PUCN, and a second end of which is connected to the pull-up node PU.

The noise reduction control end may include the third clock signal input end CLK and the fourth clock signal input end CLKB, and the output control end may the first clock signal input end CLKM.

The shift register unit may include the first gate driving signal output end OUTPUT_N', the second gate driving signal output end OUTPUT_N, the third gate driving signal output end OUTPUT_N+1' and the fourth gate driving signal output end OUTPUT_N+1.

The output circuit 12 may include: a first output transistor M7, a gate electrode of which is connected to the pull-up node PU, a drain electrode of which is connected to the first gate driving signal output end OUTPUT_N', and a source electrode of which is connected to the fourth clock signal input end CLKB; a second output transistor M4, a gate electrode of which is connected to the pull-up node PU, a drain electrode of which is connected to the third clock signal input end CLK, and a source electrode of which is connected to the second gate driving signal output end OUTOUT_N; a third output transistor M9, a gate electrode of which is connected to the pull-up node PU, a drain electrode of which is connected to the third clock signal input end CLK, and a source electrode of which is connected to the third gate driving signal output end OUTPUT_N+1'; a fourth output transistor M0, a gate electrode of which is connected to the pull-up node PU, a drain electrode of which is connected to the fourth gate driving signal output end OUTPUT_N+1, and a source electrode of which is connected to the fourth clock signal input end CLKB; a fifth output transistor M10, a gate electrode of which is connected to the first clock signal input end CLKM, a drain electrode of which is connected to the first gate driving signal output end OUTPUT_N', and a source electrode of which is connected to the high voltage input end VGH; a sixth output transistor M12, a gate electrode of which is connected to the first clock signal input end CLKM, a drain electrode of which is connected to the high voltage input end, and a source electrode of which is connected to the third gate driving signal output end OUTPUT_N+1'; a first noise reduction transistor M6, a gate electrode of which is connected to the fourth clock signal input end CLKB, a drain electrode of which is connected to the second gate driving signal output end OUTPUT_N, and a source electrode of which is connected to the low voltage input end; and a second noise reduction transistor M8, a gate electrode of which is connected to the third clock signal input end CLK, a drain electrode of which is connected to the fourth gate driving signal output end OUTPUT_N+1, and a source electrode of which is connected to the low voltage input end.

As shown in FIG. 3, in the first embodiment of the present disclosure, all the transistors may be, but not limited to, n-type transistors.

Figure 4:
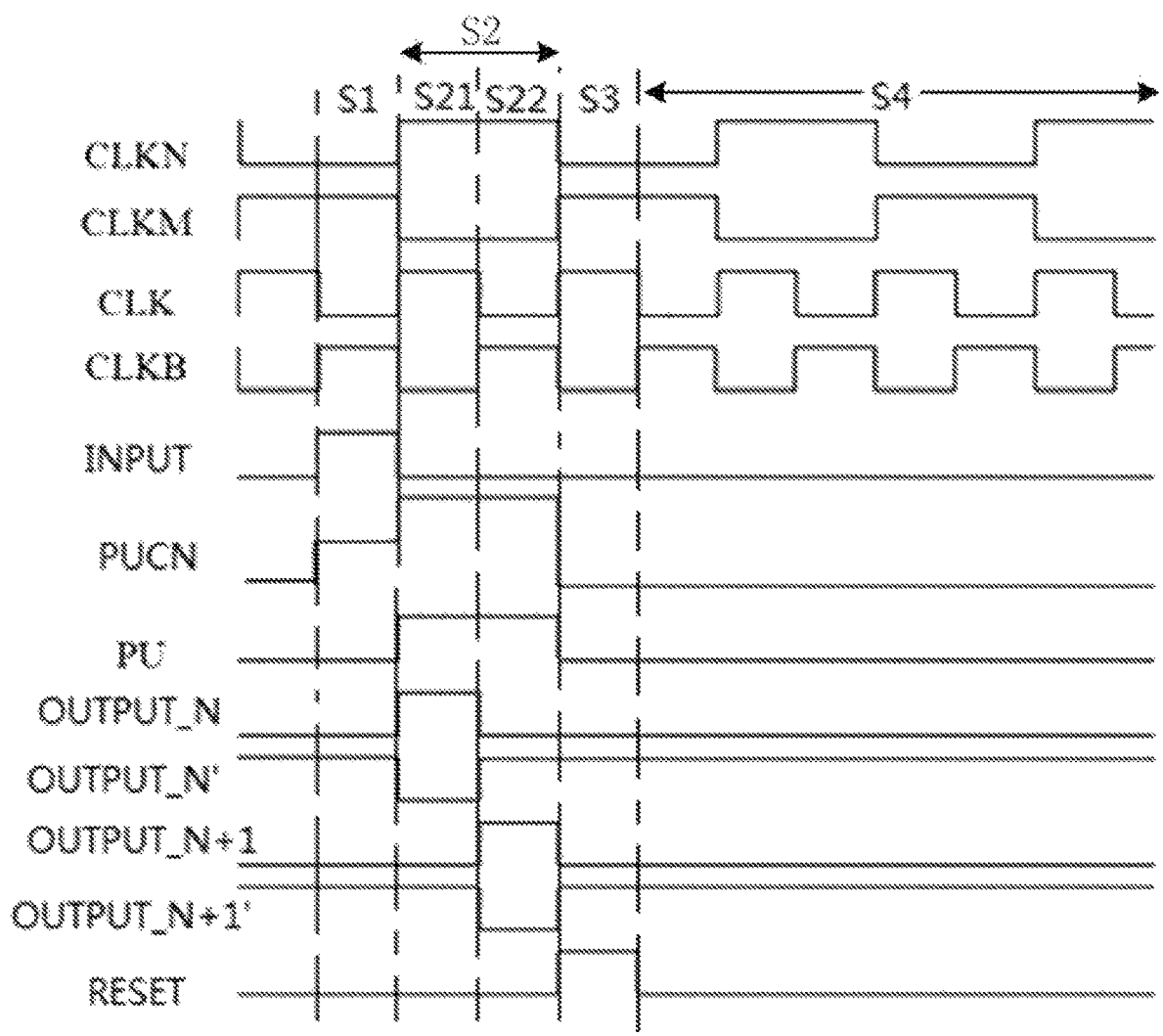
FIG. 4 is a time sequence diagram of the shift register unit according to the first embodiment of the present disclosure.

As shown in FIG. 4, during the operation of the shift register unit in FIG. 3, at an input stage S1, a high voltage may be applied to INPUT and CLKM, and a low voltage may be applied to RESET and CLKN, so as to turn on M1 and M5, thereby to enable the potential at PUCN to be the high voltage. M3 may be turned on, so as to enable PU to be electrically connected to CLKN, and enable the potential at PU to be the low voltage. Due to the high voltage applied to CLKM, both M10 and M12 may be turned on, so as to enable OUTPUT_N' and OUTPUT_N+1' to output the high voltage. The high voltage may be applied to CLKB, so as to turn on M6 and M8, thereby to enable OUTPUT_N and OUTPUT_N+1 to be maintained at the low voltage VGL.

Within a first output time period S21 of the output stage S2, the low voltage may be applied to INPUT and RESET, the high voltage may be applied to CLKN, the low voltage may be applied to CLKM, the high voltage may be applied to CLK, and the low voltage may be applied to CLKB, so as to enable C1 to bootstrap the potential at PUCN. M3 may be turned on, so as to enable the potential at PU to be the high voltage. M7, M4, M0 and M9 may be turned on, so as to enable OUTPUT_N' to be electrically connected to CLKB, enable OUTPUT_N to be electrically connected to CLK, enable OUTPUT_N+1 to be electrically connected to CLKB, and enable OUTPUT_N+1' to be electrically connected to CLK. M8 may be turned on, and M6 may be turned off, so as to enable OUTPUT_N+1 to receive the low voltage VGL. At this time, the first gate driving signal output end OUTPUT_N' and the fourth gate driving signal output end OUTPUT_N+1 may output the low voltage, and the second gate driving signal output end OUTPUT_N and the third gate driving signal output end OUTPUT_N+1' may output the high voltage.

Within a second output time period S22 of the output stage S2, the low voltage may be applied to INPUT and RESET, the high voltage may be applied to CLKN, the low voltage may be applied to CLKM, the low voltage may be applied to CLK, and the high voltage may be applied to CLKB, so as to enable C1 to bootstrap the potential at PUCN. M3 may be turned on, so as to enable the potential at PU to be the high voltage. M7, M4, M0 and M9 may be turned on, so as to enable OUTPUT_N' to be electrically connected to CLKB, enable OUTPUTN to be electrically connected to CLK, enable OUTPUT_N+1 to be electrically connected to CLKB, and enable OUTPUT_N+1' to be electrically connected to CLK. M6 may be turned on and M8 may be turned off, so as to enable OUTPUT_N to output the low voltage VGL. At this time, the first gate driving signal output end OTUPUT_N' and the fourth gate driving signal output end OUTPUT_N+1 to output the high voltage, and enable the second gate driving signal output end OUTPUT_N and the third gate driving signal output end OUTPUT_N+1' to output the low voltage.

At a resetting stage S3, the high voltage may be applied to RESET, the low voltage may be applied to INPUT, the low voltage may be applied to CLKN, the high voltage may be applied to CLKM, the high voltage may be applied to CLK, and the low voltage may be applied to CLKB, so as to turn on M2, thereby to pull down the potential at PU to the low voltage VGL. M11 may be turned on, so as to pull down the potential at PU to be the low voltage VGL. Under the control of CLKM, OUTPUT_N' and the OUTPUT_N+1' may receive the high voltage VGH; under the control of CLK, OUTPUT_N+1 may receive the low voltage VGL; and under the control of CLKB, OUTPUT_N may receive the low voltage VGL. At this time, the first gate driving signal output end OUTPUT_N' and the third gate driving signal output end OUTPUT_N+1' may output the high voltage VGH, and the second gate driving signal output end OUTPUT_N and the fourth gate driving signal output end OUTPUT_N+1 may output the low voltage VGL.

At one half of an output cutoff maintenance stage S4, the high voltage may be applied to CLKM. At this time, a noise reduction function for PUCN and PU may be maintained through M5 and M11, and OUTPUT_N' and OUTPUT_N+1' may output the high output continuously through M10 and M12. In addition, at one half of the output cutoff maintenance stage S4, the high voltage may be applied to CLK, and at this time, OUTPUT_N+1 may output the low voltage through M8. At the other half of the output cutoff maintenance stage S4, the high voltage may be applied to CLKB, and at this time, OTUPUT_N may output the low voltage through M6.

As shown in FIG. 4, a first clock signal from CLKM may have a phase reverse to a second clock signal from CLKN, a third clock signal from CLK may have a phase reverse to a fourth clock signal from CLKB, and a frequency of the first clock signal may be half of a frequency of the third clock signal.

FIG. 5 shows a circuit diagram of the shift register unit in the second embodiment of the present disclosure. The shift register unit in FIG. 5 differs from that in FIG. 3 in that the gate electrodes of M6 and M8 are connected to CLKM, i.e., the noise reduction control end includes the first clock signal input end CLKM.

The shift register unit in FIG. 5 has a same noise reduction effect as that in FIG. 3. As compared with the shift register unit in FIG. 3, it is able for the shift register unit in FIG. 5 to reduce a capacitance on the third clock signal input end CLK and a capacitance on the fourth clock signal input end CLKB (the frequency of each of the third clock signal and the fourth clock signal is higher than that of the first clock signal), so it is able to reduce the power consumption of the shift register unit, and reduce a time for a rising edge and a time for a falling edge of the gate driving signal from each gate driving signal output end.

FIG. 6 shows a circuit diagram of the shift register unit in the third embodiment of the present disclosure. The shift register unit in FIG. 6 differs from that in FIG. 3 in that the drain electrode of M1 is connected to the input end INPUT.

The present disclosure further provides in some embodiments a method for driving the above-mentioned shift register unit, which includes: controlling, by a common circuit, a potential at a pull-up node under the control of an input end, a resetting end and a first clock signal input end; and controlling, by an output circuit, 2M gate driving signal output ends to output gate driving signals respectively under the control of the pull-up node, a noise reduction end and an output control end, where M is an integer greater than 1.

According to the method in the embodiments of the present disclosure, through the common circuit and the output circuit, the corresponding gate driving signals may be applied to a first gate electrode and a second gate electrode of each driving transistor of pixels circuits in at least two rows respectively. As a result, it is able to reduce the number of the transistors of the shift register unit, thereby to facilitate the achievement of a narrow bezel.

To be specific, the common circuit may include a pull-up control node control sub-circuit and a pull-up node control sub-circuit. The controlling, by the common circuit, the potential at the pull-up node under the control of the input end, the resetting end and the first clock signal input end may include: controlling, by the pull-up control node control sub-circuit, a potential at a pull-up control node under the control of the input end, the resetting end and the first clock signal input end; and controlling, by the pull-up node control sub-circuit, the potential at the pull-up node under the control of the pull-up control node and the first clock signal input end.

To be specific, M may be 2. The controlling, by the pull-up control node control sub-circuit, the potential at the pull-up control node under the control of the input end, the resetting end and the first clock signal input end includes: at an input stage, controlling, by the pull-up control node control sub-circuit, the pull-up control node to be electrically connected to a first voltage input end or the input end under the control of the input end, and controlling, by the pull-up control node control sub-circuit, an input signal from the input end to be written into the pull-up control node under the control of the first clock signal input end; at an output stage, bootstrapping, by the pull-up control node control sub-circuit, the potential at the pull-up control node; and at a resetting stage, resetting, by the pull-up control node control sub-circuit, the potential at the pull-up control node under the control end of the resetting end and the first clock signal input end.

The controlling, by the pull-up node control sub-circuit, the potential at the pull-up node under the control of the pull-up control node and the first clock signal input end may include: at the input stage, controlling, by the pull-up node control sub-circuit, the pull-up node to be electrically connected to a second clock signal input end under the control of the pull-up control node, and controlling, by the pull-up node control sub-circuit, the pull-up node to be electrically connected to a second voltage input end under the control of the first clock signal input end, so as to enable the potential at the pull-up node to be a second voltage; at the output stage, controlling, by the pull-up node control sub-circuit, the pull-up node to be electrically connected to the second clock signal input end under the control of the pull-up control node, so as to enable the potential at the pull-up node to be an active voltage; and at the resetting stage, controlling, by the pull-up node control sub-circuit, the pull-up node to be electrically connected to the second voltage input end under the control of the first clock signal input end, so as to reset the potential at the pull-up node.

To be specific, the output stage may include a first output time period and a second output time period arranged sequentially, and the output control end may include the first clock signal input end. The controlling, by the output circuit, the 2M gate driving signal output ends to output gate driving signals respectively under the control of the pull-up node, the noise reduction control end and the output control end may include: at the input stage and the resetting stage, controlling, by the output circuit, a first gate driving signal output end and a third gate driving signal output end to be electrically connected to the first voltage input end under the control of the first clock signal input end, controlling, by the output circuit, a fourth gate driving signal output end to be electrically connected to the second voltage input end under the control of the noise reduction control end, and controlling, by the output circuit, a second gate driving signal output end to be electrically connected to the second voltage input end under the control of the noise reduction control end, so as to enable the first gate driving signal output end and the third gate driving signal output end to output a first voltage, and enable the second gate driving signal output end and the fourth gate driving signal output end to output the second voltage; within the first output time period, controlling, by the output circuit, the first gate driving signal output end to be electrically connected to a fourth clock signal input end, controlling the second gate driving signal output end to be electrically connected to a third clock signal input end, controlling the fourth gate driving signal output end to be electrically connected to the fourth clock signal input end and controlling the third gate driving signal output end to be electrically connected to the third clock signal input end under the control of the pull-up node, and controlling, by the output circuit, the fourth gate driving signal output end to be electrically connected to the second voltage input end under the control of the third clock signal input end, so as to enable the first gate driving signal output end and the fourth gate driving signal output end to output the second voltage, and enable the second gate driving signal output end and the third gate driving signal output end to output the first voltage; and within the second output time period, controlling, by the output circuit, the first gate driving signal output end to be electrically connected to the fourth clock signal input end, controlling the second gate driving signal output end to be electrically connected to the third clock signal input end, controlling the fourth gate driving signal output end to be electrically connected to the fourth clock signal input end and controlling the third gate driving signal output end to be electrically connected to the third clock signal input end under the control of the pull-up node, and controlling, by the output circuit, the second gate driving signal output end to be electrically connected to the second voltage input end under the control of the third clock signal input end, so as to enable the first gate driving signal output end and the fourth gate driving signal output end to output the first voltage, and enable the second gate driving signal output end and the third gate driving signal output end to output the second voltage.

The present disclosure further provides in some embodiments a gate driving circuit, which includes a plurality of the above-mentioned shift register units connected to each other in a cascaded manner. An input end of a first-level shift register unit of the gate driving circuit is configured to receive a corresponding input signal, and a resetting end of a last-level shift register unit of the gate driving circuit is configured to receive a corresponding resetting signal. An input end of an $A^{th}$-level shift register unit is connected to a $(2M)^{th}$ gate driving signal output end of an $(A-1)^{th}$-level shift register unit, and a resetting end of a $B^{th}$-level shift register unit is connected to a second gate driving signal output end of a $(B+1)^{th}$-level shift register unit, where A is an integer greater than 1, M is an integer greater than 1, and B is a positive integer and smaller than the number of levels of the shift register units of the gate driving circuit.

Figure 7:
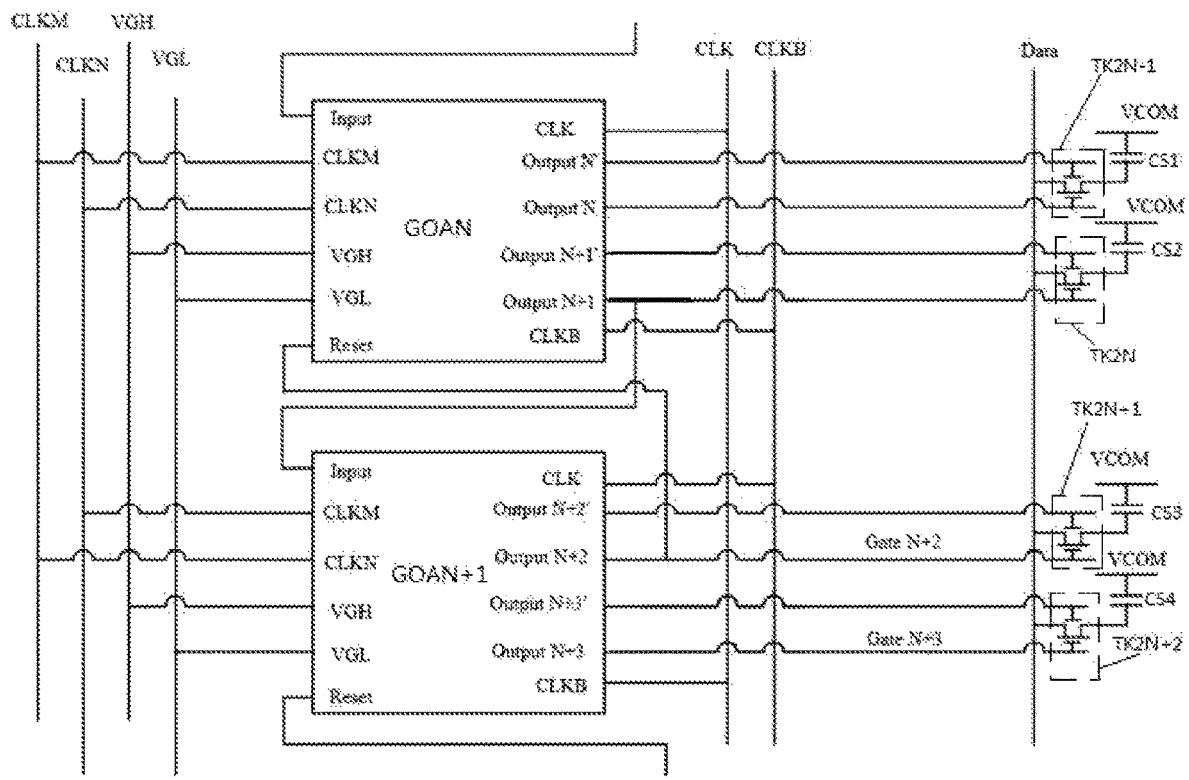
FIG. 7 is a schematic view showing a cascading relationship between two adjacent levels of shift register units of a gate driving circuit when M is 2 according to one embodiment of the present disclosure.

FIG. 7 shows a cascading relationship between two adjacent levels of shift register units of the gate driving circuit when M is 2.

In FIG. 7, GOAN represents an $N^{th}$-level shift register unit, and GOAN+1 represents an $(N+1)^{th}$-level shift register unit, where N is a positive integer. OUTPUT_N' represents a first gate driving signal output end of GOAN, OUTPUT_N represents a second gate driving signal output end of GOAN, OUTPUT_N+1' represents a third gate driving signal output end of GOAN, and OUTPUT_N+1 represents a fourth gate driving signal output end of GOAN. OUTPUT_N+2' represents a first gate driving signal output end of GOAN+1, OUTPUT_N+2 represents a second gate driving signal output end of GOAN+1, OUTPUT_N+3' represents a third gate driving signal output end of GOAN+1, and OUTPUT_N+3 represents a fourth gate driving signal output end of GOAN+1.

A resetting end RESETN of GOAN is connected to OUTPUT_N+2, and an input end INPUTN+1 of GOAN+1 is connected to OUTPUT_N+1. In addition, in FIG. 7, TK2N−1 represents a switching transistor of each pixel unit in an $(2N-1)^{th}$ row, TK2N represents a switching transistor of each pixel unit in an $(2N)^{th}$ row, TK2N+1 represents a switching transistor of each pixel unit in an $(2N+1)^{th}$ row, and TK2N+2 represents a switching transistor of each pixel unit in an $(2N+2)^{th}$ row. TK2N−1, TK2N, TK2N+1 and TK2N+2 are each a double-gate transistor. OUTPUT_N' is connected to a first gate electrode of TK2N−1, and the first gate electrode of TK2N−1 is a top gate electrode. OUTPUT_N is connected to a second gate electrode of TK2N−1, and the gate second electrode of TK2N−1 is a bottom gate electrode. OUTPUT_N+1' is connected to a first gate electrode of TK2N, the first gate electrode of TK2N is a top gate electrode. OUTPUT_N+1 is connected to a second gate electrode of TK2N, and the second gate electrode of TK2N is a bottom gate electrode. OUTPUT_N+2' is connected to a first gate electrode of TK2N+1, and the first gate electrode of TK2N+1 is a top gate electrode. OUTPUT_N+2 is connected to a second gate electrode of TK2N+1, and the second gate electrode of TK2N+1 is a bottom gate electrode. OUTPUT_N+3' is connected to a first gate electrode of TK2N+2, and the first gate electrode of TK2N+2 is a top gate electrode. OUTPUT_N+3 is connected to a second gate electrode of TK2N+2, and the second gate electrode is a bottom gate electrode.

In FIG. 7, Data represents a data line, CS1 represents a first capacitor, CS2 represents a second capacitor, CS2 represents a third capacitor, CS4 represents a fourth capacitor, and VCOM represents a common electrode voltage.

The present disclosure further provides in some embodiments a display device including the above-mentioned gate driving circuit.

To be specific, the display device may further include a display substrate and pixel units arranged in an array form on the display substrate. Each pixel unit may include a switching transistor, and the switching transistor may be a double-gate transistor. A first gate driving signal output end of an $n^{th}$-level shift register unit may be connected to first gate electrodes of the switching transistors of pixel units in a $(2n-1)^{th}$ row, a second gate driving signal output end of the $n^{th}$-level shift register unit may be connected to second gate electrodes of the switching transistors of the pixel units in the $(2n-1)^{th}$ row, a third gate driving signal output end of the $n^{th}$-level shift register unit may be connected to first gate electrodes of the switching transistors of pixel units in a $(2n)^{th}$ row, and a fourth gate driving signal output end of the $n^{th}$-level shift register unit may be connected to second gate electrodes of the switching transistors of the pixel units in the $(2n)^{th}$ row, where n is a positive integer.

Figure 8:
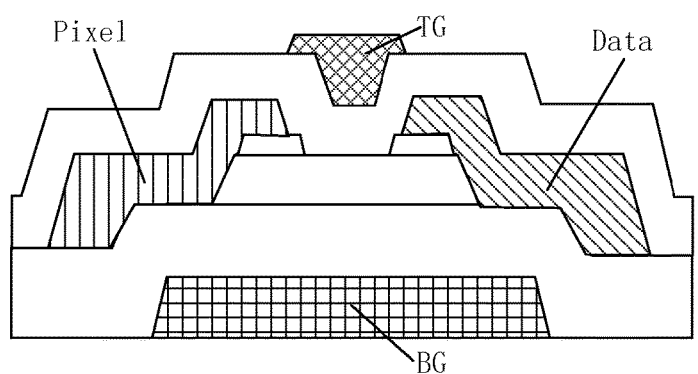
FIG. 8 is a schematic view showing a switching transistor including a top gate electrode and a bottom gate electrode according to one embodiment of the present disclosure.

As shown in FIG. 8, each driving transistor may include a top gate electrode TG and a bottom gate electrode BG. When a low voltage is applied to TG and a high voltage is applied to BG, the driving transistor may be turned on. In FIG. 8, Pixel represents a pixel unit, and Data represents a data line.

The display device may be any product or member having a display function, e.g., mobile phone, flat-panel computer, television, display, laptop computer, digital photo frame or navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising a common circuit and an output circuit, wherein the common circuit is connected to a first clock signal input end, a second clock signal input end, an input end, a resetting end, a first voltage input end, a second voltage input end and a pull-up node, and configured to control a potential at the pull-up node under the control of the input end, the resetting end and the first clock signal input end; and the output circuit is connected to the pull-up node, the first voltage input end, the second voltage input end, a noise reduction control end, an output control end and 2M gate driving signal output ends, and configured to control the 2M gate driving signal output ends to output gate driving signals respectively under the control of the pull-up node, the noise reduction control end and the output control end, where M is an integer greater than 1, wherein the common circuit comprises a pull-up control node control sub-circuit and a pull-up node control sub-circuit;

the pull-up control node control sub-circuit is connected to the input end, the resetting end, the first clock signal input end, the first voltage input end, the second voltage input end and a pull-up control node, and configured to control a potential at the pull-up control node under the control of the input end, the resetting end and the first clock signal input end; and the pull-up node control sub-circuit is connected to the pull-up control node, the pull-up node, the first clock signal input end, the second clock signal input end and the second voltage input end, and configured to control the potential at the pull-up node under the control of the pull-up control node and the first clock signal input end, wherein M is 2, wherein the pull-up control node control sub-circuit comprises:

a first pull-up control node control transistor, a gate electrode of which is connected to the input end, a first electrode of which is connected to the first voltage input end or the input end, and a second electrode of which is connected to the pull-up control node;

a second pull-up control node control transistor, a gate electrode of which is connected to the first clock signal input end, a first electrode of which is connected to the input end, and a second electrode of which is connected to the pull-up control node; and a third pull-up control node control transistor, a gate electrode of which is connected to the resetting end, a first electrode of which is connected to the pull-up control node, and a second electrode of which is connected to the second voltage input end.

2. A shift register unit, comprising a common circuit and an output circuit, wherein the common circuit is connected to a first clock signal input end, a second clock signal input end, an input end, a resetting end, a first voltage input end, a second voltage input end and a pull-up node, and configured to control a potential at the pull-up node under the control of the input end, the resetting end and the first clock signal input end; and the output circuit is connected to the pull-up node, the first voltage input end, the second voltage input end, a noise reduction control end, an output control end and 2M gate driving signal output ends, and configured to control the 2M gate driving signal output ends to output gate driving signals respectively under the control of the pull-up node, the noise reduction control end and the output control end, where M is an integer greater than 1, wherein the common circuit comprises a pull-up control node control sub-circuit and a pull-up node control sub-circuit;

the pull-up control node control sub-circuit is connected to the input end, the resetting end, the first clock signal input end, the first voltage input end, the second voltage input end and a pull-up control node, and configured to control a potential at the pull-up control node under the control of the input end, the resetting end and the first clock signal input end; and the pull-up node control sub-circuit is connected to the pull-up control node, the pull-up node, the first clock signal input end, the second clock signal input end and the second voltage input end, and configured to control the potential at the pull-up node under the control of the pull-up control node and the first clock signal input end, wherein M is 2, wherein the pull-up node control sub-circuit comprises:

a first pull-up node control transistor, a gate electrode of which is connected to the pull-up control node, a first electrode of which is connected to the second clock signal input end, and a second electrode of which is connected to the pull-up node;

a second pull-up node control transistor, a gate electrode of which is connected to the first clock signal input end, a first electrode of which is connected to the pull-up node, and a second electrode of which is connected to the second voltage input end; and a storage capacitor, a first end of which is connected to the pull-up control node, and a second end of which is connected to the pull-up node.

3. A shift register unit, comprising a common circuit and an output circuit, wherein the common circuit is connected to a first clock signal input end, a second clock signal input end, an input end, a resetting end, a first voltage input end, a second voltage input end and a pull-up node, and configured to control a potential at the pull-up node under the control of the input end, the resetting end and the first clock signal input end; and the output circuit is connected to the pull-up node, the first voltage input end, the second voltage input end, a noise reduction control end, an output control end and 2M gate driving signal output ends, and configured to control the 2M gate driving signal output ends to output gate driving signals respectively under the control of the pull-up node, the noise reduction control end and the output control end, where M is an integer greater than 1, wherein the noise reduction control end comprises a third clock signal input end and a fourth clock signal input end, and the output control end comprises the first clock signal input end, wherein M is 2, wherein the shift register unit comprises a first gate driving signal output end, a second gate driving signal output end, a third gate driving signal output end and a fourth gate driving signal output end, wherein the output circuit comprises:

a first output transistor, a gate electrode of which is connected to the pull-up node, a first electrode of which is connected to the first gate driving signal output end, and a second electrode of which is connected to the fourth clock signal input end;

a second output transistor, a gate electrode of which is connected to the pull-up node, a first electrode of which is connected to the third clock signal input end, and a second electrode of which is connected to the second gate driving signal output end;

a third output transistor, a gate electrode of which is connected to the pull-up node, a first electrode of which is connected to the third clock signal input end, and a second electrode of which is connected to the third gate driving signal output end;

a fourth output transistor, a gate electrode of which is connected to the pull-up node, a first electrode of which is connected to the fourth gate driving signal output end, and a second electrode of which is connected to the fourth clock signal input end;

a fifth output transistor, a gate electrode of which is connected to the first clock signal input end, a first electrode of which is connected to the first gate driving signal output end, and a second electrode of which is connected to the first voltage input end;

a sixth output transistor, a gate electrode of which is connected to the first clock signal input end, a first electrode of which is connected to the first voltage input end, and a second electrode of which is connected to the third gate driving signal output end;

a first noise reduction transistor, a gate electrode of which is connected to the fourth clock signal input end, a first electrode of which is connected to the second gate driving signal output end, and a second electrode of which is connected to the second voltage input end; and a second noise reduction transistor, a gate electrode of which is connected to the third clock signal input end, a first electrode of which is connected to the fourth gate driving signal output end, and a second electrode of which is connected to the second voltage input end.

4. A shift register unit, comprising a common circuit and an output circuit, wherein the common circuit is connected to a first clock signal input end, a second clock signal input end, an input end, a resetting end, a first voltage input end, a second voltage input end and a pull-up node, and configured to control a potential at the pull-up node under the control of the input end, the resetting end and the first clock signal input end; and the output circuit is connected to the pull-up node, the first voltage input end, the second voltage input end, a noise reduction control end, an output control end and 2M gate driving signal output ends, and configured to control the 2M gate driving signal output ends to output gate driving signals respectively under the control of the pull-up node, the noise reduction control end and the output control end, where M is an integer greater than 1, wherein the noise reduction control end comprises the first clock signal input end, and the output control end comprises the first clock signal input end, wherein M is 2, wherein the shift register unit comprises a first gate driving signal output end, a second gate driving signal output end, a third gate driving signal output end and a fourth gate driving signal output end, wherein the output circuit comprises:

a first output transistor, a gate electrode of which is connected to the pull-up node, a first electrode of which is connected to the first gate driving signal output end, and a second electrode of which is connected to a fourth clock signal input end;

a second output transistor, a gate electrode of which is connected to the pull-up node, a first electrode of which is connected to a third clock signal input end, and a second electrode of which is connected to the second gate driving signal output end;

a third output transistor, a gate electrode of which is connected to the pull-up node, a first electrode of which is connected to the third clock signal input end, and a second electrode of which is connected to the third gate driving signal output end;

a fourth output transistor, a gate electrode of which is connected to the pull-up node, a first electrode of which is connected to the fourth gate driving signal output end, and a second electrode of which is connected to the fourth clock signal input end;

a fifth output transistor, a gate electrode of which is connected to the first clock signal input end, a first electrode of which is connected to the first gate driving signal output end, and a second electrode of which is connected to the first voltage input end;

a sixth output transistor, a gate electrode of which is connected to the first clock signal input end, a first electrode of which is connected to the first voltage input end, and a second electrode of which is connected to the third gate driving signal output end;

a first noise reduction transistor, a gate electrode of which is connected to the first clock signal input end, a first electrode of which is connected to the second gate driving signal output end, and a second electrode of which is connected to the second voltage input end; and a second noise reduction transistor, a gate electrode of which is connected to the first clock signal input end, a first electrode of which is connected to the fourth gate driving signal output end, and a second electrode of which is connected to the second voltage input end.

5. The shift register unit according to claim 1, wherein the first voltage input end is a high voltage input end, and a second voltage input end is a low voltage input end.

6. The shift register unit according to claim 3, wherein a first clock signal has a phase reverse to a second clock signal, a third clock signal has a phase reverse to a fourth clock signal, and a frequency of the first clock signal is half of a frequency of the third clock signal.

7. The shift register unit according to claim 4, wherein a first clock signal has a phase reverse to a second clock signal, a third clock signal has a phase reverse to a fourth clock signal, and a frequency of the first clock signal is half of a frequency of the third clock signal.

8. A method for driving the shifter register unit according to claim 1, comprising:

controlling, by the common circuit, a potential at the pull-up node under the control of an input end, a resetting end and the first clock signal input end; and controlling, by the output circuit, 2M gate driving signal output ends to output gate driving signals respectively under the control of the pull-up node, the noise reduction end and the output control end, where M is an integer greater than 1.

9. The method according to claim 8, wherein the common circuit comprises the pull-up control node control sub-circuit and the pull-up node control sub-circuit, wherein the controlling, by the common circuit, the potential at the pull-up node under the control of the input end, the resetting end and the first clock signal input end comprises:

controlling, by the pull-up control node control sub-circuit, a potential at a pull-up control node under the control of the input end, the resetting end and the first clock signal input end; and controlling, by the pull-up node control sub-circuit, the potential at the pull-up node under the control of the pull-up control node and the first clock signal input end.

10. The method according to claim 9, wherein M is 2, wherein the controlling, by the pull-up control node control sub-circuit, the potential at the pull-up control node under the control of the input end, the resetting end and the first clock signal input end comprises:

at an input stage, controlling, by the pull-up control node control sub-circuit, the pull-up control node to be electrically connected to the first voltage input end or the input end under the control of the input end, and controlling, by the pull-up control node control sub-circuit, the input signal from the input end to be written into the pull-up control node under the control of the first clock signal input end;

at an output stage, bootstrapping, by the pull-up control node control sub-circuit, the potential at the pull-up control node; and at a resetting stage, resetting, by the pull-up control node control sub-circuit, the potential at the pull-up control node under the control end of the resetting end and the first clock signal input end.

11. The method according to claim 10, wherein M is 2, wherein the controlling, by the pull-up node control sub-circuit, the potential at the pull-up node under the control of the pull-up control node and the first clock signal input end comprises:

at the input stage, controlling, by the pull-up node control sub-circuit, the pull-up node to be electrically connected to the second clock signal input end under the control of the pull-up control node, and controlling, by the pull-up node control sub-circuit, the pull-up node to be electrically connected to the second voltage input end under the control of the first clock signal input end, to enable the potential at the pull-up node to be a second voltage;

at the output stage, controlling, by the pull-up node control sub-circuit, the pull-up node to be electrically connected to the second clock signal input end under the control of the pull-up control node, to enable the potential at the pull-up node to be an active voltage; and at the resetting stage, controlling, by the pull-up node control sub-circuit, the pull-up node to be electrically connected to the second voltage input end under the control of the first clock signal input end, to reset the potential at the pull-up node.

12. The method according to claim 11, wherein the output stage comprises a first output time period and a second output time period arranged sequentially, and the output control end comprises the first clock signal input end, wherein the controlling, by the output circuit, the 2M gate driving signal output ends to output gate driving signals respectively under the control of the pull-up node, the noise reduction control end and the output control end comprises:

at the input stage and the resetting stage, controlling, by the output circuit, a first gate driving signal output end and a third gate driving signal output end to be electrically connected to the first voltage input end under the control of the first clock signal input end, controlling, by the output circuit, a fourth gate driving signal output end to be electrically connected to the second voltage input end under the control of the noise reduction control end, and controlling, by the output circuit, a second gate driving signal output end to be electrically connected to the second voltage input end under the control of the noise reduction control end, to enable the first gate driving signal output end and the third gate driving signal output end to output a first voltage, and enable the second gate driving signal output end and the fourth gate driving signal output end to output the second voltage;

within the first output time period, controlling, by the output circuit, the first gate driving signal output end to be electrically connected to a fourth clock signal input end, controlling the second gate driving signal output end to be electrically connected to a third clock signal input end, controlling the fourth gate driving signal output end to be electrically connected to the fourth clock signal input end and controlling the third gate driving signal output end to be electrically connected to the third clock signal input end under the control of the pull-up node, and controlling, by the output circuit, the fourth gate driving signal output end to be electrically connected to the second voltage input end under the control of the third clock signal input end, to enable the first gate driving signal output end and the fourth gate driving signal output end to output the second voltage, and enable the second gate driving signal output end and the third gate driving signal output end to output the first voltage; and within the second output time period, controlling, by the output circuit, the first gate driving signal output end to be electrically connected to the fourth clock signal input end, controlling the second gate driving signal output end to be electrically connected to the third clock signal input end, controlling the fourth gate driving signal output end to be electrically connected to the fourth clock signal input end and controlling the third gate driving signal output end to be electrically connected to the third clock signal input end under the control of the pull-up node, and controlling, by the output circuit, the second gate driving signal output end to be electrically connected to the second voltage input end under the control of the third clock signal input end, to enable the first gate driving signal output end and the fourth gate driving signal output end to output the first voltage, and enable the second gate driving signal output end and the third gate driving signal output end to output the second voltage.

13. The method according to claim 12, wherein a first clock signal has a phase reverse to a second clock signal, a third clock signal has a phase reverse to a fourth clock signal, and a frequency of the first clock signal is half of a frequency of the third clock signal.

14. The method according to claim 12, wherein the first voltage is a high voltage, and the second voltage is a low voltage.

15. A gate driving circuit, comprising a plurality of levels of the shift register units according to claim 1 and connected to each other in a cascaded manner, wherein an input end of a first level of shift register unit included in the gate driving circuit is configured to receive a corresponding input signal, and a resetting end of a last level of shift register unit included in the gate driving circuit is configured to receive a corresponding resetting signal; and an input end of an $A^{th}$ level of shift register unit is connected to a $(2M)^{th}$ gate driving signal output end of an $(A-1)^{th}$ level of shift register unit, and a resetting end of a $B^{th}$ level of shift register unit is connected to a second gate driving signal output end of a $(B+1)^{th}$ level of shift register unit, where A is an integer greater than 1, M is an integer greater than 1, and B is a positive integer and smaller than the number of levels of the shift register units included in the gate driving circuit.

16. A display device, comprising the gate driving circuit according to claim 15.

17. The display device according to claim 16, further comprising a display substrate and pixel units arranged in an array form on the display substrate, wherein each pixel unit comprises a switching transistor;

the switching transistor is a double-gate transistor; and a first gate driving signal output end of an $n^{th}$ level of shift register unit is connected to first gate electrodes of the switching transistors of pixel units in a $(2n-1)^{th}$ row, a second gate driving signal output end of the $n^{th}$ level of shift register unit is connected to second gate electrodes of the switching transistors of the pixel units in the $(2n-1)^{th}$ row, a third gate driving signal output end of the $n^{th}$ level of shift register unit is connected to first gate electrodes of the switching transistors of pixel units in a $(2n)^{th}$ row, and a fourth gate driving signal output end of the $n^{th}$ level of shift register unit is connected to second gate electrodes of the switching transistors of the pixel units in the $(2n)^{th}$ row, where n is a positive integer.

* * * * *